United States Patent [19]
Frick

[11] Patent Number: 4,956,201
[45] Date of Patent: Sep. 11, 1990

[54] METHOD OF CREATING PASAGEWAYS IN NIOBIUM BY CVD OF NIOBIUM OVER SINTERED VANADIUM WHICH IS THEREAFTER LEACHED

[75] Inventor: Vincent Frick, Sacramento, Calif.

[73] Assignee: The United States of America as represented by the Secretary of the Air Force, Washington, D.C.

[21] Appl. No.: 213,065

[22] Filed: Jun. 29, 1988

[51] Int. Cl.$^5$ .......................... B05D 7/22; C23C 16/06
[52] U.S. Cl. ..................... 427/181; 427/239; 427/250; 427/352; 427/376.6; 427/376.8
[58] Field of Search ................. 427/191, 62, 203, 181, 427/205, 250, 239, 336, 352, 376.1, 376.6, 376.7, 376.8, 383.7, 180, 198, 199; 428/662; 505/818, 819, 823

[56] References Cited

U.S. PATENT DOCUMENTS 3,069,847 12/1962 Vest ....................................... 60/265
3,230,613 1/1966 Rechin et al. .......................... 29/157
4,060,693 11/1977 Meyerhoff ............................ 505/887
4,098,920 7/1978 Miller .................................. 427/251
4,115,916 9/1978 Meyerhoff ........................... 505/917

FOREIGN PATENT DOCUMENTS 1025841 4/1966 United Kingdom ................ 428/662

Primary Examiner—Sadie Childs
Attorney, Agent, or Firm—Robert L. Nathans; Donald J. Singer

[57] ABSTRACT

Method of producing a niobium component having passageways therein, including providing a refractory metal niobium alloy member having slots formed within its outer surface portions, inserting a paste of powdered vanadium into the slots, sintering the powdered vanadium paste, depositing a layer of niobium over the vanadium in the slots and over the outer surface portions of the member by chemical vapor deposition, and removing the vanadium from the slots by acid leaching to produce the niobium component.

15 Claims, 1 Drawing Sheet

ME THOD OF CREATING PASAGEWAYS IN
NIOBIUM BY CVD OF NIOBIUM OVER
SINTERED VANADIUM WHICH IS THEREAFTER
LEACHED

STATEMENT OF GOVERNMENT INTEREST

The invention described herein may be manufactured and used by or for the Government for governmental purposes without the payment of any royalty thereon.

BACKGROUND OF THE INVENTION

This invention relates to the field of forming coolant passageways in rocket thrust chambers or turbine airfoils.

A slotted niobium thrust chamber cylinder is provided, and the slots are filled with a filler material. An outer niobium overcoat is deposited over the outer surfaces of the cylinder and over the filler material and the filler material is thereafter removed by leaching to form the coolant passageways.

Future space propulsion systems will employ refractory metal thrust chambers. Chemical vapor deposition (CVD) is being used to enclose a slotted niobium liner. CVD niobium is deposited at a high temperature, at about 1200 degrees C., in a reactive gas environment. The critical step in the process is the selection and application of the later to be removed filler material in the niobium substrate liner slots. The numerous desired characteristics of the filler material are as follows: high-temperature melting point, moldable to complex flow channels with thermal and structural stability, metallurgically compatible with the niobium substrate liner at high temperature, chemically compatible with the CVD reactive gas environment, coefficient of thermal expansion similar to the substrate, will not degrade the bond of the deposited niobium, can be readily removed from the very small flow passages, leaving close tolerance, dimensionally controlled flow channels.

Earlier attempts to develop suitable temporary filler materials employed photoetched shaped and contoured strips of molybdenum for use with the niobium substrate material. Molybdenum met all the criteria, except it could not be successfully acid leached, to form the hollow coolant channels, after the CVD of the niobium outer cover. Also, thermal stresses caused the strips to shift. Further attempts were made to develop better filler materials. Metal fillers and high-temperature salts were evaluated. Powdered metal (−325 mesh) were selected to permit molding directly into the variable width and depth channel slots. This was accomplished by mixing the powders with an acrylic cement, filling the slots, and sintering the assembly to vaporize the acrylic cement and densify the metal powder. Powdered molybdenum was tried because of its solid solubility with niobium but, acid leaching of even the low-density powder was unsuccessful. Readily dissolved copper was tried in malleable wire and powder forms, but its low melting point limited the CVD process temperature and inhibited bonding of the niobium outer cover. Only iron powder fulfilled most of the requirements. However, formation of niobium-iron intermetallic compounds restricted thermal exposure time, and it also appeared that iron contamination of the substrate lands degraded the niobium deposit bond.

SUMMARY OF THE INVENTION

In accordance with the present invention, powdered vanadium in a paste was inserted within the liner slots and sintered therein before the chemical vapor deposition of the outer niobium coating. The vanadium powder filler was thereafter removed by leaching with hot dilute nitric acid. The vanadium powder has all of the aforesaid desired characteristics, for the filler material.

BRIEF DESCRIPTION OF THE DRAWINGS

Other objects, features, and advantages of the present invention will become apparent upon study of the following detailed description taken in conjunction with the drawings in which.

DETAILED DESCRIPTION OF THE PREFERRED EMBODIMENT

Figure 1:
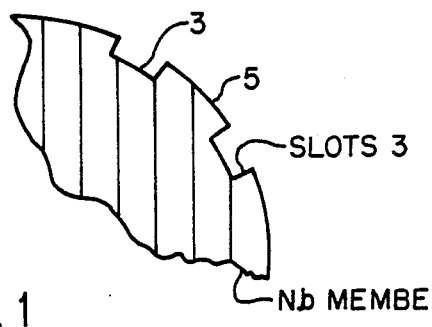
FIGS. 1, 2, 3, and 4 illustrate schematically the various steps of the method of the invention by displaying the niobium liner in cross section.

In FIG. 1, niobium alloy substrate or liner member 1 is illustrated, having the aforesaid slots 3 formed within an outer surface thereof. Niobium alloy "C-103" or "FS-85" are preferred alloys. "C-103" is about ten percent hafnium, one percent titanium, and the rest niobium. "FS-85" is 28% Ta, 10% W, 1% Zr and the rest niobium; see Grisaffe et al U.S. Pat. No. 3,931,447.

A paste of acrylic cement and vanadium powder was prepared in a nitrogen dry box. The vanadium powder was 325 mesh, marketed by "Alpha Products", a division of Morton Thiokol, and bore the designation "m2N7/cat. #00398". Since oxygen tends to make the substrate brittle, a low oxygen content is preferred. The cement bore the designation "Nicrobraz, cat. #500", marketed by Wall-Colmonoy Inc.

Figure 2:
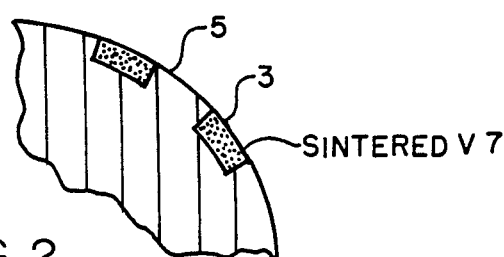

The resulting vanadium paste was packed into the slots (FIG. 2), thereafter heated at about 1100° C. for about one hour in a vacuum of $1 \times 10^{-5}$ Torr, to sinter the vanadium and cause the cement to be evaporated. While use of a paste is preferred, the powdered vanadium could be pressed into the cavities, as is obvious to the skilled worker in the art.

Figure 3:
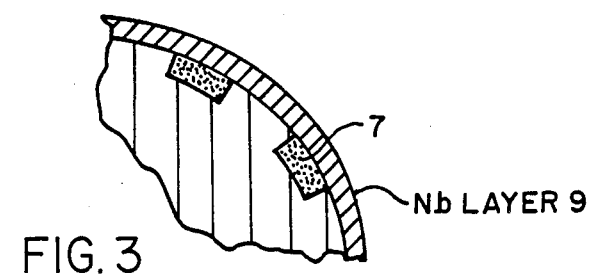

A pure niobium layer 9 was thereafter deposited by chemical vapor deposition over the lands 5, separating the slots, and over the sintered vanadium 7, in a reactive gas environment, at about 1200 degrees C. The process was halted when a layer of niobium having a thickness of 0.04 inches was deposited. See FIG. 3.

Figure 4:
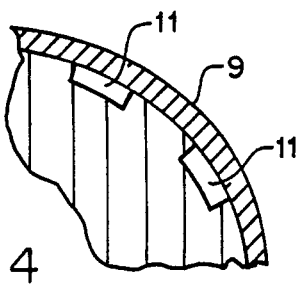

Hot nitric acid having a 25% concentration by volume was thereafter applied to the filler at a temperature of about 110°–115° C. to remove the vanadium filler by leaching as shown in FIG. 4. The time of exposure of the filler to the acid is of course a function of the strength of the acid (which could be 25-50%) and the amount of the filler to be removed.

Thus the outer cylinder portions of the liner now contain enclosed hollow coolant passageways 11 for cooling the liner in the conventional manner. Excellent bonds of layer 9 to the substrate 1 were achieved for specimens with burst pressures ranging between 10,000 and 12,400 PSI for a plurality of samples. A one hour hot $N_2O_4$, compatibility flow test was employed. This pressure range is over two times the proof pressure required for the liner.

The vanadium powder filler met all of the numerous "desired characteristics" set forth hereinabove, and provided coolant channels 11, with close tolerance control and excellent CVD niobium deposited bonds. The present invention is not to be limited to rocket thrust liners, and may be applied to other bodies such as air-cooled refractory metal turbine blades, and the scope of the invention is to be defined only by the language of the following claims, and art recognized equivalents thereof.

What is claimed is:

1. Method of producing a niobium component having passageways therein comprising the steps of:
    (a) providing a refractory metal niobium alloy member having slots formed within outer surface portions of said member;
    (b) inserting a paste of powdered vanadium into said slots;
    (c) sintering the powdered vanadium paste;
    (d) depositing by chemical vapor deposition a layer of niobium over the vanadium in said slots and over the outer surface portions of said member; and
    (e) removing the vanadium from said slots by leaching to produce said niobium component.

2. The method of claim 1 wherein step (e) is performed by dilute nitric acid.

3. The method of claim 1 wherein step (d) is performed by chemical vapor deposition.

4. The method of claim 2 wherein step (d) is performed by chemical vapor deposition.

5. The method of claim 3 wherein step (d) is terminated after the deposition of a niobium layer having a thickness of at least about 0.04 inches.

6. The method of claim 4 wherein step (d) is terminated after the deposition of a niobium layer having a thickness of at least about 0.04 inches.

7. The method of claim 3 wherein said layer is deposited at about 1200° C. in a reactive gas environment.

8. The method of claim 4 wherein said layer is deposited at about 1200° C. in a reactive gas environment.

9. The method of claim 5 wherein said layer is deposited at about 1200° C. in a reactive gas environment.

10. The method of claim 6 wherein said layer is deposited at about 1200° C. in a reactive gas environment.

11. The method of claim 3 wherein step (c) is performed in a vacuum.

12. The method of claim 5 wherein step (c) is performed in a vacuum.

13. The method of claim 10 wherein step (c) is performed n a vacuum.

14. The method of producing a niobium component having passageways therein comprising the steps of:
    (a) providing a refractory metal niobium alloy member having cavities formed within outer surface portions of said member;
    (b) inserting powdered vanadium into said cavities;
    (c) sintering the powdered vanadium;
    (d) depositing by chemical vapor deposition a layer of niobium over the vanadium in said cavities and over the outer surface portions of said member; and
    (e) removing the vanadium from said cavities by leaching to produce said niobium component.

15. The method of claim 14 wherein step (c) is performed in a vacuum.

* * * * *